United States Patent [19]

Sato

[11] Patent Number: 5,278,092
[45] Date of Patent: Jan. 11, 1994

[54] METHOD OF FORMING CRYSTAL SEMICONDUCTOR FILM

[75] Inventor: Nobuhiko Sato, Atsugi, Japan

[73] Assignee: Canon Kabushiki Kaisha, Tokyo, Japan

[21] Appl. No.: 818,440

[22] Filed: Dec. 27, 1991

Related U.S. Application Data

[63] Continuation of Ser. No. 563,630, Aug. 7, 1990, abandoned.

[30] Foreign Application Priority Data

Aug. 7, 1989 [JP] Japan .................................. 1-202846

[51] Int. Cl.$^5$ ............................................ H01L 21/205
[52] U.S. Cl. ........................................ 437/90; 156/610; 156/612; 437/83
[58] Field of Search ...................... 437/62, 83, 90, 225; 156/610, 612

[56] References Cited

U.S. PATENT DOCUMENTS

| | | | |
|---|---|---|---|
| 3,979,237 | 9/1976 | Morcom et al. | 437/83 |
| 4,494,303 | 1/1985 | Celler et al. | 437/62 |
| 4,800,527 | 1/1989 | Ozaki et al. | 365/182 |
| 4,999,313 | 3/1991 | Arikawa et al. | 437/90 |

FOREIGN PATENT DOCUMENTS

| | | |
|---|---|---|
| 0224646 | 6/1987 | European Pat. Off. . |
| 0241316 | 10/1987 | European Pat. Off. . |
| 0276960 | 8/1988 | European Pat. Off. . |
| 0363100 | 4/1990 | European Pat. Off. . |

*Primary Examiner*—Mary Wilczewski
*Attorney, Agent, or Firm*—Fitzpatrick, Cella, Harper & Scinto

[57] ABSTRACT

A method of forming a crystal semiconductor by depositing on a substrate with a depression a first layer with a higher nucleation density and a smaller mechanical abrasion rate than a second layer deposited on the first layer and forming a nucleation surface by removing a minute portion of the second layer in the area of the depression, thereby uncovering the first layer. The uncovered portion of the first layer is sufficiently minute so as to form only a single nucleus from which a monocrystal is grown by a crystal formation process from the single nucleus. The monocrystal is allowed to grow beyond the area of the depression. An abrasive grain mechanically polishes the grown monocrystal to a level corresponding to the surface of the first layer, thereby flattening the monocrystal.

2 Claims, 2 Drawing Sheets

METHOD OF FORMING CRYSTAL SEMICONDUCTOR FILM

This application is a continuation of application Ser. No. 07/563,630 filed Aug. 7, 1990, now abandoned.

BACKGROUND OF THE INVENTION

1. Field of the Invention

The present invention relates to a method of forming a crystal semiconductor film. More particularly it relates to a method of forming a crystal semiconductor film, comprising forming a plurality of monocrystals on a deposition surface under control of their location and also under control of the position of grain boundaries and the size of the monocrystals, and then flattening the monocrystals formed.

The present invention can be applied in, for example, crystal semiconductor films utilized for electronic devices such as semiconductor integrated circuits and magnetic circuits, optical devices, magnetic devices, piezoelectric devices or surface acoustic devices and so forth.

2. Related Background Art

In the field of an SOI (silicon on insulation) technique by which a plurality of monocrystals are made to grow on an insulating substrate, a method, for example, is proposed which is based on a selective nucleation depending on the difference in nucleation density between surface materials (T. Yonehara et al. (1987), Extended Abstracts of the 19th SSDM.191). This crystal formation method is described with reference to FIGS. 2A to 2C. First, as shown in FIG. 2A, on a substrate material 201 having a surface 203 with a smaller nucleation density, a region 207 having a surface with a larger nucleation density than the surface 203 is disposed in appropriate diameter and intervals. If a predetermined crystal formation processing is applied to this substrate, a nucleus 209 of a deposit is produced only on the surface of the region 207 and no nucleation takes place on the surface 203 (FIG. 2B). Then, the surface of the region 207 is called a nucleation surface ($S_{NDL}$), and the surface 203, a non-nucleation surface ($S_{NDS}$). If the nucleus 209 produced on the nucleation surface 207 is further made to grow, it grows to a crystal grain 210 (FIG. 2C), and further grows over the non-nucleation surface 203 beyond the region of the nucleation surface 207. In a short time it comes into contact with a crystal grain 210' having grown from an adjacent nucleation surface 207', and a grain boundary 211 is thus formed. In this conventional crystal formation method, reports have been made on an example in which amorphous $Si_3N_4$ is used in the nucleation surface 207, $SiO_2$ is used in the non-nucleation surface 203, and a plural number of Si monocrystals are formed by CVD (see the above paper); and an example in which $SiO_2$ is used in the non-nucleation surface 203, Si ions are implanted into the non-nucleation surface 203 by the use of focused ion beams so that a region serving as the nucleation surface 207 is formed, and a plural number of Si monocrystals are formed by CVD (The 35th Applied Physics Related Joint Lecture Meeting, 1988, 28p-M-9).

When, however, plural crystal grains are formed in a lattice dot form by the above crystal formation method in which the monocrystals are formed under control of their location, the following problems may often occur, and hence some difficulties may be caused in the fabrication of semiconductor integrated circuits or other devices.

That is to say, in the above crystal formation method, it is difficult to obtain flat crystals under the present state in the art and a greater part of the resulting crystals is in a mass form. However, in the case when an element is formed, it is very effective to flatten the top of the crystals, from the viewpoints of improving performance of the element, making uniform the characteristics and improving the yield. In addition, if one element is formed on each of these monocrystals and each element is formed separately from each other through an insulating material, a region usually required for the separation of elements can be remarkably reduced and the devices can be more highly integrated. In recent years, it has been found that the performance of an element can be improved when a semiconductor layer on an insulating material is made thinner (International Workshop on Future Electron Devices, 1988). Nonetheless, no satisfactory technique has been established for flattening the crystals.

As methods for obtaining a thin layer with a flat surface, three methods have been hitherto proposed. The first is a method in which the upper part of, for example, an Si layer is oxidized and then removed using an etchant of an acid type (i.e., an oxide layer removing method), the second is a method in which a layer is made thin by reactive ion etching, and the third is a selective mechanochemical abrasive method in which a special chemical polishing solution is mixed and the remarkable difference in abrasion rates between Si and $SiO_2$ is utilized (i.e., mechanochemical polishing method) (see T. Hamaguchi and N. Endo, Japanese Journal of Applied Physics, Vol. 56, No. 11, p.1480; T. Hamaguchi, N. Endo, M. Kimura and A. Ishitani, Japanese Journal of Applied Physics, Vol. 23, No. 10, 1984, PD.LO-815; T. Hamaguchi, N. Endo, M. Kimura and M. Nakamae, Proceeding of International Electron Device Meeting, p.688, 1985, Washington D.C., U.S.A.).

The oxide layer removing method must use a process such as high-pressure oxidation so that the rate of oxidation can be accelerated, resulting in a very expensive process. In addition, when the surface of a starting material is irregular, the surface must be flattened by any method before it is oxidized.

Moreover, in the case when grain boundaries or crystals with different orientation are present in the Si layer, there are many problems in achieving uniform and flat oxidation, since the oxidation may be accelerated along the grain boundaries or the rate of oxidation may be anisotropic depending on the crystal orientation.

The second method, the reactive ion etching, requires regulation of etching time to carry out thickness control in order to obtain a thin layer in a desired thickness, and there are many problems in its controllability, reproducibility, uniformity and mass productivity for accurately controlling the crystals to have a film thickness of 1 $\mu m$ or less. Moreover, what is to be additionally questioned is that ions having energy are made directly incident on the surface of semiconductor crystals. This leaves the problem of damaging the surface layer.

In the last mechanochemical polishing method, when used in usual silicon wafers, polishing is carried out using a polishing solution and a polyurethane cloth. The polishing solution is obtained by suspending abrasive grains called colloidal silica, comprising $SiO_2$ with a diameter of about 0.01 $\mu m$, in a weakly alkaline solution. This is a polishing method in which the physical polishing action attributable to the friction between abrasive grains ($SiO_2$) and a silicone wafer is combined with the chemical dissolving action of silicon in the weakly alkaline polishing solution because of an increase in temperature during the friction. The mechanochemical polishing is used in a final step when substrates such as silicon wafers are polished, and the surface of the substrate thus polished is a flat, strain-free mirror surface.

A selective polishing technique based on this mechanochemical polishing method employs a weakly alkaline solution as a processing solution, and utilizes the mechanism that the chemical reaction between the solution and a body to be polished differs depending on materials. This method is comprised of the chemical reaction of this solution and a mechanical removing step so that a substance to be formed is rubbed off with a polishing cloth. For example, when Si is etched using ethylenediamine-pyrocatechol, $Si(OH)_6^{2-}$ is formed on the Si surface as a result of redox reaction in the course of ionization of amine, and it produces a chelate with pyrocatechol, which is then dissolved in the solution. It is through the selective polishing that this $Si(OH)_6^{2-}$ is removed from the Si surface by the mechanical action attributable to the fiber of the polishing cloth. In the case when the body to be polished is comprised of $SiO_2$ regions and Si regions, the effect of rubbing off using the polishing cloth may remarkably decrease if the Si regions surrounded by the $SiO_2$ regions are abraded to the height of the $SiO_2$ regions. Thus, the $SiO_2$ regions are made to serve as a stopper and only the Si regions are flatly polished.

In the above ordinary mechanochemical polishing technique and selective mechanochemical polishing technique, a chemical reaction step is present and hence a remarkable difference in abrasion rate, depending on the crystal orientation of Si, can be observed in both instances.

For example, it is known that in the case of the ordinary mechanochemical polishing technique the (100) face can be processed at a rate which is greater by 10 to 20% than the (111) face, and in the case of the selective mechanochemical polishing technique the (100) face and (110) face can be polished at a rate which is 10 times as fast as the (111) face.

Such dependence of abrasion rates on the face orientation is not a problem in the case of a large-area monocrystalline substrate having perfectly uniform face orientation as in the case of a bulk Si substrate. However in the case of an Si thin layer formed on an amorphous insulating substrate, it is very rare that a layer with perfectly uniform face orientation. In many instances, formed is a thin film is formed, comprised of an aggregate of polycrystal grains with more or less non-uniformity in face orientation or an aggregate of relatively large single crystals in a mosaic form having grain sub-boundaries. In such instances in which the face orientation is not perfectly uniform or grain boundaries, grain sub-boundaries or twin crystal grain boundaries are present, it is very difficult to obtain flat surfaces by the mechanochemical polishing process having a chemical factor, because of its face orientation dependence. In addition, chemical etching is accompanied with acceleration reaction that may take place at a defective region, where the processing preferentially proceeds at the part in which grain boundaries and so forth are present, resulting in further deterioration of surface flatness.

It has recently been sought that a photoelectric transducer be formed on a transparent substrate to make it serve as an image input part of a facsimile, etc. or that an element be formed on a large, inexpensive glass substrate. In particular, if monocrystals are formed on such a substrate in a mutually separate form, it is possible to increase the performance of an element and expand the scope of its utilization because the same characteristics as those of an element on a bulk semiconductor can be exhibited. The above crystal formation method that forms monocrystals under control of their location is a crystal formation method which is very effective also in this respect. When a group of crystals obtained by such a method are flattened, the problems as pointed out in the above have often occurred even with use of the polishing process as described above. Hence, it has been difficult to form a thin layer with greater flatness, with better accuracy (with a film thickness of about 1 $\mu$m or less) and also with less non-uniformity.

SUMMARY OF THE INVENTION

An object of the present invention is to provide a method of forming a crystal semiconductor film that has overcome the various problems as described above.

Another object of the present invention is to provide a method of forming a crystal semiconductor film, that can obtain a very flat crystal surface by forming a monocrystal or a group of monocrystals on a substrate having a low nucleation density, under control of the location and size of the monocrystal(s), and thereafter flattening the surface(s) of the monocrystal(s) formed.

Another object of the present invention is to provide a method of forming a crystal semiconductor film, that may exhibit less non-uniformity on each wafer and also can form a thinner layer (with a film thickness of about 1 $\mu$m or less) in a good yield.

Further another object of the present invention is to provide a method of forming a crystal semiconductor film, comprising the steps of;

depositing on a substrate surface having a depression, a first material with a higher nucleation density and a smaller mechanical abrasion rate to an abrasive grain to form a layer comprising the first material;

depositing on the layer comprising said first material a second material with a lower nucleation density and a greater mechanical abrasion rate to said abrasive grain than the first material to form a layer comprising the second material;

forming a nucleation surface by removing a minute part of said layer comprising the second material, at the part of said depression, thereby uncovering said layer comprising the first material to have a sufficiently minute area so as to form only a single nucleus from which said monocrystal is grown by a crystal formation processing; and subjecting the substrate having the nucleation surface thus formed, to a processing for forming a crystal having a greater mechanical abrasion rate to said abrasive grain than said first material so that a monocrystal is made to grow beyond the area of said depression from the nucleus formed on said nucleation surface;

and the step of mechanically polishing said grown monocrystal by the use of said abrasive grain to the level corresponding to the surface of said layer comprising the first material so that said monocrystal is flattened.

DESCRIPTION OF THE PREFERRED EMBODIMENTS

Figure 1A:
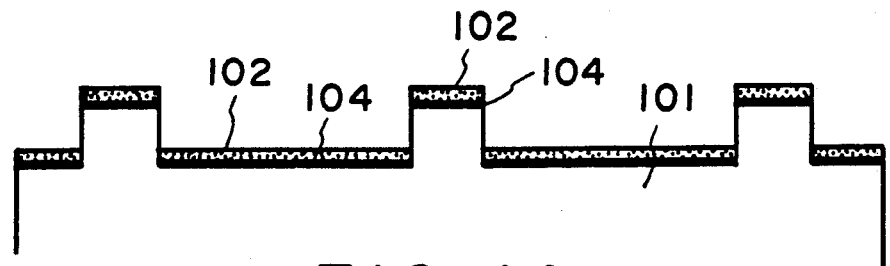
FIGS. 1A to 1D are schematic illustrations diagrammatically showing the steps of forming a crystal semiconductor film according to the present invention.

A preferred method of forming a crystal semiconductor film according to the present invention comprises the steps of;

depositing on a substrate surface having a depression, a first material with a higher nucleation density and a smaller mechanical abrasion rate to an abrasive grain to form a layer comprising the first material;

depositing on the layer comprising said first material a second material with a lower nucleation density and a greater mechanical abrasion rate to said abrasive grain than the first material to form a layer comprising the second material;

forming a nucleation surface by removing a minute part of said layer comprising the second material, at the part of said depression, thereby uncovering said layer comprising the first material to have a sufficiently minute area so as to form only a single nucleus from which said monocrystal is grown by a crystal formation processing; and subjecting the substrate having the nucleation surface thus formed, to a processing for forming a crystal having a greater mechanical abrasion rate to said abrasive grain than said first material so that a monocrystal is made to grow beyond the area of said depression from the nucleus formed on said nucleation surface;

and the step of mechanically polishing said grown monocrystal by the use of said abrasive grain to the level corresponding to the surface of said layer comprising the first material so that said monocrystal is flattened.

According to the present invention, mechanical polishing is employed and hence it is possible to overcome the difficulties in flattening monocrystals, caused by the acceleration etching phenomenon ascribable to the crystal face orientation dependence or crystal defects in the mechanochemical polishing. In addition, since a material having a mechanical abrasion rate to abrasive grains which is the same as or lower than the substance to be polished is partially disposed on the surface of a substrate to any desired height, on the material upon which the substance to be polished is deposited, and the substance is polished. It is also possible to stop polishing at the region comprising the material having a mechanical abrasion rate to abrasive grains which is the same as or lower than the substance to be polished that has been uncovered to the surface. This makes it possible to provide a semiconductor thin film having less non-uniformity in the thickness of the thin film and also having a good accuracy.

The depression that serves as the region in or on which the semiconductor thin film is formed may have a large area of, for example, not less than 80 μm square. Even in such an instance, a practical yield can be obtained. In the case when a plurality of wafers are polished in the same batch, it is possible to provide a semiconductor thin film having less non-uniformity between the wafers, without causing scrapes of the material serving as an abrasion stopper, even when some wafers have different thickness in a microscopic order or even when the rate of abrasion become non-uniform because of the difference in the pressure applied to the wafers.

According to the method of the present invention for forming a crystal semiconductor, a semiconductor thin film comprising a monocrystal or a plurality of monocrystals can be formed on an amorphous substrate in the state that each monocrystal is surrounded by an insulating material. It is also possible to form a crystal semiconductor film free from excess crystals, having a flat crystal surface, and having a film thickness with well controlled accuracy (not more than 1 μm). Thus, the employment of the semiconductor thin film obtained by the method of the present invention enables formation of semiconductor integrated circuits without non-uniformity in characteristics between them and yet with a good yield.

The present invention was made based on a finding obtained as a result of intensive studies on the steps of polishing a crystal. When in the polishing step a projected part serving as a stopper on the progress of abrasion was formed of a quartz substrate of which the mechanical abrasion rate to abrasive grains is the same as that of monocrystal grains to be polished, it was discovered that the stopper itself was abraded thereby often damaging the controllability of film thickness in polishing and the uniformity within a surface and between wafers. Thus, the material for the stopper should be a material whose mechanical abrasion rate to abrasive grains is lower than that of the monocrystal grains to be polished and which may cause no problem at all even when used in a semiconductor device fabricating process. As such a material, a silicon nitride film is conventionally used in a semiconductor process and known to be suitable in view of the advantages that it is very hard having a Mohs hardness of 9, and the mechanical abrasion rate to abrasive grains is very low. The silicon nitride film, however, is a material having a relatively high nucleation density, and is a material that can serve as a nucleation surface in the above crystal formation process. Thus, when the silicon nitride film is previously provided on a substrate and a projected stopper on the progress of abrasion is formed, followed by crystal formation processing, it often occurs that crystal nuclei are also formed on the stopper. This often brings about a problem in the controllability of the location of crystal formation.

If a material for the stopper of abrasion progress is selectively disposed after the crystal formation processing, it would be possible in principle to carry out polishing using this material as a stopper. At present, however, it is very difficult to selectively dispose with ease the material for the abrasion stopper in such a way. It may be possible to use usual lithography to leave only a material for the stopper only on the substrate after deposition. This, however, causes problems in the application of a resist, the deterioration of pattern exposure accuracy and so forth because the crystals have grown in projected forms.

As a means for solving these problems, the present invention provides a method of forming a crystal semiconductor film, comprising the steps of;

depositing on a substrate surface having a depression a material with a higher nucleation density and a smaller mechanical abrasion rate to an abrasive grain to form an abrasion stopper;

depositing next a material with a lower nucleation density to form a surface serving as a non-nucleation surface;

forming next a nucleation surface by uncovering a minute part of the surface of a film comprising the material having a higher nucleation density, to have a sufficiently minute area so as to form a nucleus from which a single crystal is grown;

subjecting the substrate to a crystal formation processing to form on said nucleation surface a single monocrystal having a greater mechanical abrasion rate to said abrasive grain than said abrasion stopper; and mechanically polishing the resulting monocrystal by the use of abrasive grains until the monocrystal is abraded to the level corresponding to the surface of the film as an abrasion stopper comprising the material having a lower mechanical abrasion rate to the abrasive grain so that said monocrystal is flattened.

In the present invention, a substrate material comprising a material having a lower nucleation density as exemplified by quartz glass, $SiO_2$, glass, etc. is first covered with a material having a higher nucleation density and also having a lower mechanical abrasion rate to abrasive grains (as exemplified by a silicon nitride film). Next, the surface of the material having a higher nucleation density is covered with a material having a lower nucleation density (as exemplified by a silicon oxide film) while a region that serves as a nucleation surface remains. Then, the substrate thus obtained, having a nucleation surface and a non-nucleation surface, is subjected to crystal formation processing, so that unnecessary nucleation from the part other than the nucleation surface (i.e., the non-nucleation surface) is prevented and a monocrystal is formed from a nucleus formed on the nucleation surface. Subsequently, the surface of the monocrystal thus formed is mechanically polished using abrasive grains, so that, at the upper part of the substrate, the material having a low nucleation density is also abraded and the polishing proceeds until the monocrystal is abraded to the level corresponding to the surface of the material having a higher hardness. Thus, the grown monocrystal can be flattened.

The layer thickness of the material having a lower mechanical abrasion rate to the abrasive grains may vary depending on the type of abrasive grains and the polishing time. The thickness may be in such a state that the material is not scooped out at the terraced portion during polishing or is not so thin as to be scraped out in the course of polishing. For example, it is suitable for the thickness to be about 100 Å, and more preferably about 300 Å.

The non-uniformity in thickness of the resulting crystal depends on the dimensions and depth of the bottom of the depression. The depth of the depression should be not more than 1/10, and preferably not more than 1/50, of the length of one side of the depression.

The stopper is present between adjacent depressions, and the width thereof should be not less than the depth of the depression.

The size of the nucleation surface should be not more than 10 μm square, and preferably not more than 5 μm square, from the viewpoint of the controlling of crystal location and also from the viewpoint of the crystal growth that a nucleus is selectively formed only on the nucleation surface. The nucleation surface made to have such a size enables formation of only one nucleus from which the monocrystal is grown by crystal growth on the nucleation surface.

In the present invention, colloidal silica can be preferably used as the abrasive grain. In practical polishing, colloidal silica to which water has been added is used.

The present invention is described below with reference to FIG. 1 by giving Examples.

EXAMPLE 1

First, as shown in FIG. 1A, square depressions of 1,500 Å in depth and 10 μm×10 μm in bottom area each, having rectangular cross sections, were formed by photolithography on a substrate material 101 made of quartz glass. Next, over the whole top surface of the substrate material, a thin film (here an $Si_3N_4$ layer) 104 comprised of a material forming a nucleation surface was formed by LPCVD to have a film thickness of 500 Å. Subsequently, a thin film (here an $SiO_2$ layer) 102 comprised of a material forming a non-nucleation surface was formed on the $Si_3N_4$ layer 104 by normal pressure CVD method to have a film thickness of 500 Å. The $Si_3N_4$ film and $SiO_2$ film thus obtained were both amorphous films.

Figure 1B:
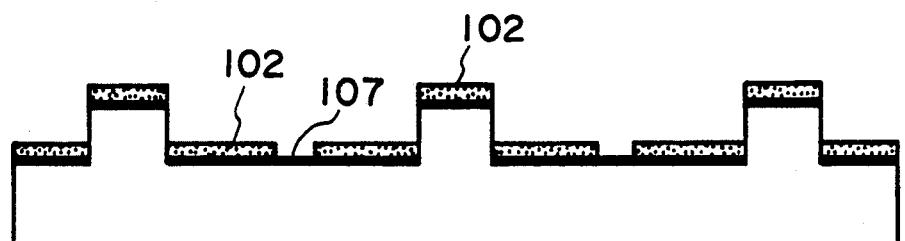

Next, as shown in FIG. 1B, the $SiO_2$ layer at the center of each depression was removed by usual pattern processing so that $Si_3N_4$ layer was uncovered in a size of 1 μm square. A nucleation surface 107 comprising $Si_3N_4$ was thus uncovered.

Figure 1C:
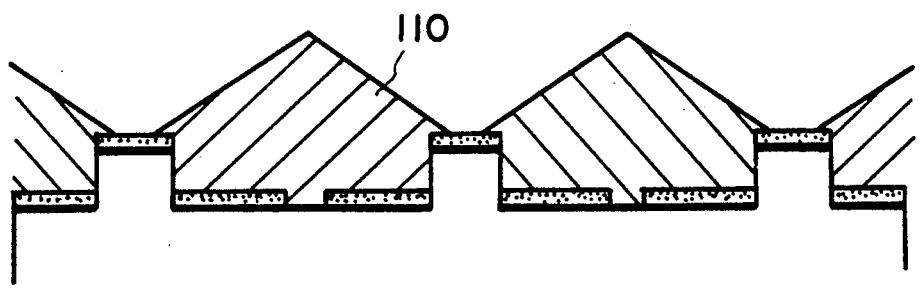

Next, as shown in FIG. 1C, the resulting substrate was placed in an CVD apparatus, and subjected to crystal formation processing under conditions of an inner pressure of 150 Torr and a substrate temperature of 950° C., using $SiH_2Cl_2/HCl/H_2=0.53/1.6/100$ (l/min) as an introducing gas. As a result, an Si nucleus was formed only on the nucleation surface 107 corresponding to the region of $Si_3N_4$, and an Si monocrystal 110 was formed in a shape that a facet is projected about 4.5 μm from the depression.

Figure 1D:
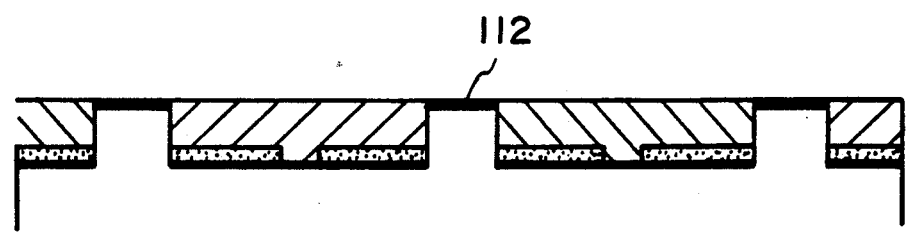

Next, using a processing solution containing $SiO_2$ colloidal silica (average particle diameter: 0.01 μm) as abrasive processing solution, the grown crystals were polished by means of a surface polishing apparatus usually used for polishing silicon wafers. Here, the polishing was carried out at a pressure of 220 g/cm², at a temperature ranging from 30° to 40° C. and for 15 minutes. After polishing, the polished surface was observed to confirm that as shown in FIG. 1D the $SiO_2$ regions were also scraped at the same time the Si monocrystals were abraded, and the polishing was stopped at the time the $Si_3N_4$ region serving as a stopper 112 was uncovered to the surface. As a result, an Si monocrystal thin layer with a flat surface and of 900 Å±50 Å in thickness was obtained on the 4 inch quartz glass substrate in a good accuracy. On nine other sheets of substrates polished at the same time, flat Si monocrystal thin films were also obtained with good accuracy with less non-uniformity in thicknesses which were within the range of from 900 Å±50 Å.

EXAMPLE 2

First, square depressions of 4,000 Å in depth and 20 μm×20 μm in bottom area each were formed by photolithography on a substrate material 101 made of quartz glass. Next, over the whole top surface of the substrate material, an $Si_3N_4$ layer 104 was formed by LPCVD to have a film thickness of 700 Å. Subsequently, an $SiO_2$ layer 102 was formed on the $Si_3N_4$ layer by normal pressure CVD to have a film thickness of 500 Å. Next, the $SiO_2$ layer at the center of each depression was removed by a pattern processing so that $Si_3N_4$ layer was uncovered in a size of 1 μm square. A nucleation surface 107 was thus uncovered. The resulting substrate was placed in an CVD apparatus, and then subjected to crystal formation processing under conditions of an inner pressure of 150 Torr and a substrate temperature of 950° C., using $SiH_2Cl_2/HCl/H_2=0.53/1.6/100$ (l/min) as an introducing gas. As a result, an Si nucleus was formed only on the region 107 of $Si_3N_4$, and an Si monocrystal 110 was formed in a shape that a facet is projected about 12.5 μm from the depression.

Next, using a processing solution containing $SiO_2$ colloidal silica (average particle diameter: 0.01 μm), the grown crystals were polished by means of a surface polishing apparatus usually used for polishing silicon wafers, at a pressure of 220 g/cm², at a temperature ranging from 30° to 40° C. and for 60 minutes. As a result, the $SiO_2$ regions were all scraped out at the time the Si crystals were abraded about 1 μm, and the polishing was completed where the $Si_3N_4$ regions were uncovered to the surface. As a result, an Si monocrystal thin layer with a flat surface and 3,260 Å±140 Å in thickness was obtained on the 4 inch quartz glass substrate with good accuracy. On nine other sheets of substrates polished at the same time, flat Si monocrystal thin films were also obtained with good accuracy with a thickness within the range of from 3,260 Å±140 Å.

As described above, according to the method of the present invention for forming a crystal semiconductor, a semiconductor thin film comprising a monocrystal or a plurality of monocrystals can be formed on an amorphous substrate in the state that each monocrystal is surrounded by an insulating material. It is also possible to form a crystal semiconductor film free from lack of crystals, having a flat crystal surface, and having a film thickness with a well controlled accuracy (not more than 1 μm). Thus, the employment of the semiconductor thin film obtained by the method of the present invention enables formation of semiconductor integrated circuits without non-uniformity in characteristics between them and yet with a good yield.

In addition, according to the present invention, the nucleation surface is formed in such a way that the first material having a larger nucleation density, which serves as a stopper, is uncovered from the second material having a smaller nucleation density. Hence, it is possible to prevent the nucleation on the stopper, which has often occurred when the semiconductor film formation process is used in which a projected stopper on the progress of abrasion is formed and thereafter the crystal formation process is applied. This makes it possible to control the location of crystal formation in a higher accuracy.

I claim:

1. A method of forming a monocrystal silicon semiconductor film, comprising the steps of:

depositing on a glass substrate having a depression, a first material comprised of an amorphous silicon nitride with a higher nucleation density and a smaller mechanical abrasion rate to an abrasive grain to form a layer comprising the first material;

depositing on the layer comprising said first material a second material comprised of a silicon oxide with a lower nucleation density and a greater mechanical abrasion rate to said abrasive grain than said first material to form a layer comprising the second material;

forming a nucleation surface by removing a minute part of said layer comprising the second material at the part of said depression, thereby uncovering said layer comprising the first material to have a sufficiently minute area so as to form only a single nucleus from which said monocrystal is grown by a crystal formation processing; and subjecting the substrate having the nucleation surface thus formed, to a processing for forming a silicon crystal having a greater mechanical abrasion rate to said abrasive grain than said first material so that a monocrystal is made to grow beyond the area of said depression from the nucleus formed on said nucleation surface;

and the step of mechanically polishing said grown monocrystal silicon by the use of said abrasive grain to the level corresponding to the surface of said layer comprising the first material so that said monocrystal is flattened.

2. A method of forming a crystal semiconductor film according to claim 1, wherein said abrasive grain comprises colloidal silica.

* * * * *

UNITED STATES PATENT AND TRADEMARK OFFICE
CERTIFICATE OF CORRECTION

PATENT NO. : 5,278,092  
DATED : January 11, 1994  
INVENTOR(S) : Nobuhiko Sato

Page 1 of 2

It is certified that error appears in the above-indentified patent and that said Letters Patent is hereby corrected as shown below:

IN THE DRAWINGS

Figure 2A:
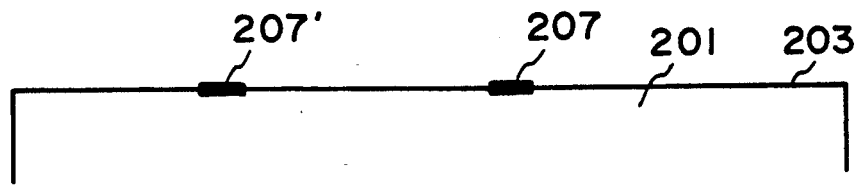
FIGS. 2A to 2C are schematic illustrations diagrammatically showing the steps of forming a crystal semiconductor film according to the prior art process.
Figure 2B:
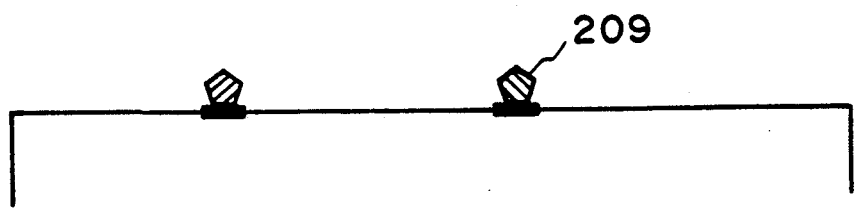
Figure 2C:
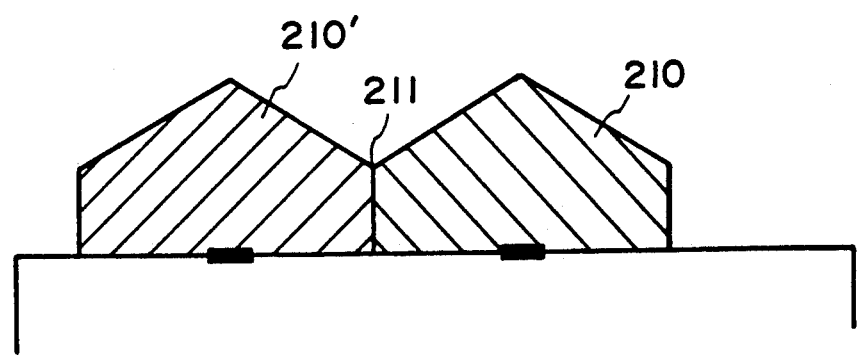

Sheet 2 of 2, Figs. 2A-2C should be labeled --PRIOR ART--.

COLUMN 3

Line 54, "orientation." should read --orientation is formed.--.
Line 55, "formed is" should be deleted.

COLUMN 4

Line 41, "of;" should read --of:--.

COLUMN 5

Line 14, "of;" should read --of:--.
Line 32, "formed," should read --formed--.

COLUMN 6

Line 3, "become" should read --becomes--.
Line 64, "of;" should read --of:--.

COLUMN 8

Line 28, "an" should read --a--.

COLUMN 9

Line 3, "an" should read --a--.

UNITED STATES PATENT AND TRADEMARK OFFICE
CERTIFICATE OF CORRECTION

PATENT NO. : 5,278,092
DATED : January 11, 1994
INVENTOR(S) : Nobuhiko Sato

It is certified that error appears in the above-indentified patent and that said Letters Patent is hereby corrected as shown below:

COLUMN 10

Line 6, "in a higher" should read --with greater--.
Line 30, "formed," should read --formed--.

Signed and Sealed this

Twenty-seventh Day of September, 1994

Attest:

BRUCE LEHMAN

*Attesting Officer*        *Commissioner of Patents and Trademarks*